United States Patent [19]
Sugimoto et al.

[11] Patent Number: 5,920,149
[45] Date of Patent: Jul. 6, 1999

[54] TERMINAL BOARD COVER AND PICTURE TUBE DEVICE USING THE SAME

[75] Inventors: Kazuhiro Sugimoto, Osaka; Katsuyo Iwasaki, Hyogo, both of Japan

[73] Assignee: Matsushita Electronics Corporation, Osaka, Japan

[21] Appl. No.: 08/982,651

[22] Filed: Dec. 2, 1997

[30] Foreign Application Priority Data

Dec. 12, 1996 [JP] Japan .................................. 8-332534

[51] Int. Cl.⁶ .................................................. H01J 29/70
[52] U.S. Cl. .......................................................... 313/440
[58] Field of Search .................................. 313/440, 421, 313/433, 413, 431, 412, 428; 335/210, 213, 212, 209

[56] References Cited

U.S. PATENT DOCUMENTS

| | | | |
|---|---|---|---|
| 3,629,750 | 12/1971 | Nienaber | 335/210 |
| 3,783,424 | 1/1974 | Torsch | 335/210 |
| 5,075,590 | 12/1991 | Lee | 313/440 |
| 5,798,606 | 8/1998 | Koga et al. | 313/440 |

*Primary Examiner*—Sandra O'Shea
*Assistant Examiner*—Joseph Williams
*Attorney, Agent, or Firm*—Merchant, Gould, Smith, Edell, Welter & Schmidt, P.A.

[57] ABSTRACT

A picture tube device comprises a CRT and a deflection yoke having a terminal board cover, wherein an adjustment tool is not completely extracted from through holes and can be smoothly shifted between through holes, and the position of another through hole can be confirmed and determined without visual confirmation, so that the position among the through holes can be easily determined. A correction circuit comprising variable resistors for correcting misconvergence is employed on a printed board installed on the deflection yoke. The printed board is covered with a terminal board cover made of insulating material and through holes for inserting an adjustment tool for adjusting the adjustment areas of the variable resistors are formed in the terminal board cover. The through holes are connected to each other with guiding grooves.

19 Claims, 11 Drawing Sheets

TERMINAL BOARD COVER AND PICTURE TUBE DEVICE USING THE SAME

FIELD OF THE INVENTION

The present invention relates to a terminal board cover that is installed on a printed board employed in an electric device such as a television or a printer, and especially to a terminal board cover covering a printed board installed on a deflection yoke that is a member of a picture tube device.

BACKGROUND OF THE INVENTION

A correction circuit for correcting mainly (i) residual misconvergence due to the magnetic field distribution design in a deflection yoke installed on a picture tube, (ii) irregularities during the winding of a coil, (iii) processing variances among the deflection yokes, or (iv) variances when a CRT (cathode ray tube) is adjusted to the DY (deflection yoke) in an ITC (integrated tube components) system, is employed on a printed board. This correction circuit comprises variable resistors and the like.

In order to ensure the security of the user and the safety of the product components (such as circuit components and terminals), a terminal board cover made of an insulating material such as resin is installed on the printed board, so that the user cannot directly touch the terminals on the printed board. Furthermore, through holes are employed on the terminal board cover above the variable resistors, which are components of the correction circuit on the printed board, so that a stick-shaped tool for adjusting the variable resistors (called "adjustment tool" below) can be inserted from outside the terminal board cover to adjust the variable resistors.

As is shown in FIG. 18, usually one through hole 7 is employed separately for each adjustment portion 6, so that the adjustment tool is guided smoothly to the adjustment area 6 of the variable resistors without being deviated from a position directly above the variable resistor. Furthermore, when several (in this prior art example: two) adjustment regions 6 for variable resistors are located closely together, a slender through hole 7, which openly connects the regions above the adjustment areas 6, is employed in the terminal board cover.

However, in the prior art employing separate through holes for each adjustment area of a variable resistor as discussed above, the position, distribution and relative position of the through holes cannot be determined precisely when the variable resistors are adjusted, because all the through holes have roughly the same circular shape. Consequently, there was the problem that after the adjustment tool has been extracted from a through hole and is about to be inserted into the next through hole, the next through hole has to be found, and some time is required to locate the position of the next through hole.

Furthermore, when employing slender through holes, which openly connect the regions above several adjustment areas located closely together, it is easy to deviate from the intended adjustment area for a variable resistor, because it is difficult to point the adjustment tool exactly at the intended adjustment area of several adjustment areas for variable resistors, so that this configuration also is hard to adjust.

SUMMARY OF THE INVENTION

It is the purpose of the present invention to overcome the problems of the prior art by providing (i) a terminal board cover, wherein the adjustment tool is not completely extracted from the through holes, the adjustment tool can be smoothly shifted between the through holes, and the position of other through holes can be confirmed and determined without visual confirmation, so that the location of the through holes can be easily determined, and (ii) a color picture tube device using the same.

According to the present invention, a terminal board cover for covering a printed board comprising adjustable circuit components, is characterized in that through holes for inserting an adjustment tool to adjust the circuit components are formed in the terminal board cover, and the through holes are connected to each other by a guiding groove.

By doing so, after an adjustment tool has been inserted into one through hole, the location of another through hole can be found easily by moving the adjustment tool along the guiding groove. This means that the adjustment of the circuit components can be easily performed, because it is possible to guess the present position of the adjustment tool by moving the adjustment tool over the guiding grooves and the working positions.

According to the present invention, it is preferable that the terminal board cover is made of an insulating material. Thus, the security of the user and the safety of the product components (such as circuit components and terminals) can be ensured.

It is preferable that the guiding groove connecting the through holes has a shape selected from cross-shape, straight shape, Z-shape, square shape, and shapes combining two or more of these shapes. Moreover, it is preferable that the guiding groove connecting the through holes has square shape with straight guiding grooves directly connecting the through holes that are diagonally opposite to each other.

It is preferable that in the terminal board cover according to the present invention, a reference position area for determining the position of an adjustment tool is formed in the guiding groove. When such a reference position area is employed, a visual confirmation to determine a reference position becomes unnecessary. Therefore, the time necessary to perform an adjustment of the circuit components can be shortened, because the confirmation of the position of the adjustment tool during the adjustment becomes easy.

It is preferable that the reference position area is concave and lower than the guiding groove, or that the reference position area is convex and higher than the guiding groove.

Furthermore, it is preferable that the guiding groove comprises an arch-shaped portion. With such a configuration, the shifting of the adjustment tool when adjusting the circuit components becomes smoother.

A picture tube device according to the present invention comprises a terminal board cover having one of the structures outlined above, or a deflection yoke on which a printed board having such a terminal board cover is installed.

In addition, a picture tube device according to the present invention comprises: a cathode ray tube having an electron gun on the inside of a neck portion; and a deflection yoke comprising a horizontal deflection coil for generating a horizontal deflection field and a vertical deflection coil for generating a vertical deflection field; and is characterized in that a correction circuit for correcting misconvergence is employed on a printed board installed on the deflection yoke. The correction circuit includes adjustable circuit components. The printed board is covered by a terminal board cover and through holes for inserting an adjustment tool to adjust circuit components of the correction circuit are formed in the terminal board cover. The through holes are connected to each other with a guiding groove. The cross-section of the guiding grooves is substantially U-shaped, however, the present invention is by no means limited to such a shape, and other shapes, such as a V-shape, are also possible.

By using the configuration as described above, after an adjustment tool has been inserted into one through hole, the location of another through hole can be found easily by moving the adjustment tool along the guiding groove. This means that the adjustment of the circuit components can be performed easily using the tactile sense, without looking at the deflection yoke around the CRT, because it is possible to guess the present position of the adjustment tool by moving the adjustment tool over the guiding grooves and the working positions.

DESCRIPTION OF THE PREFERRED EMBODIMENTS

The preferred embodiments of the present invention are described below, with reference to the drawings.

Figure 16:
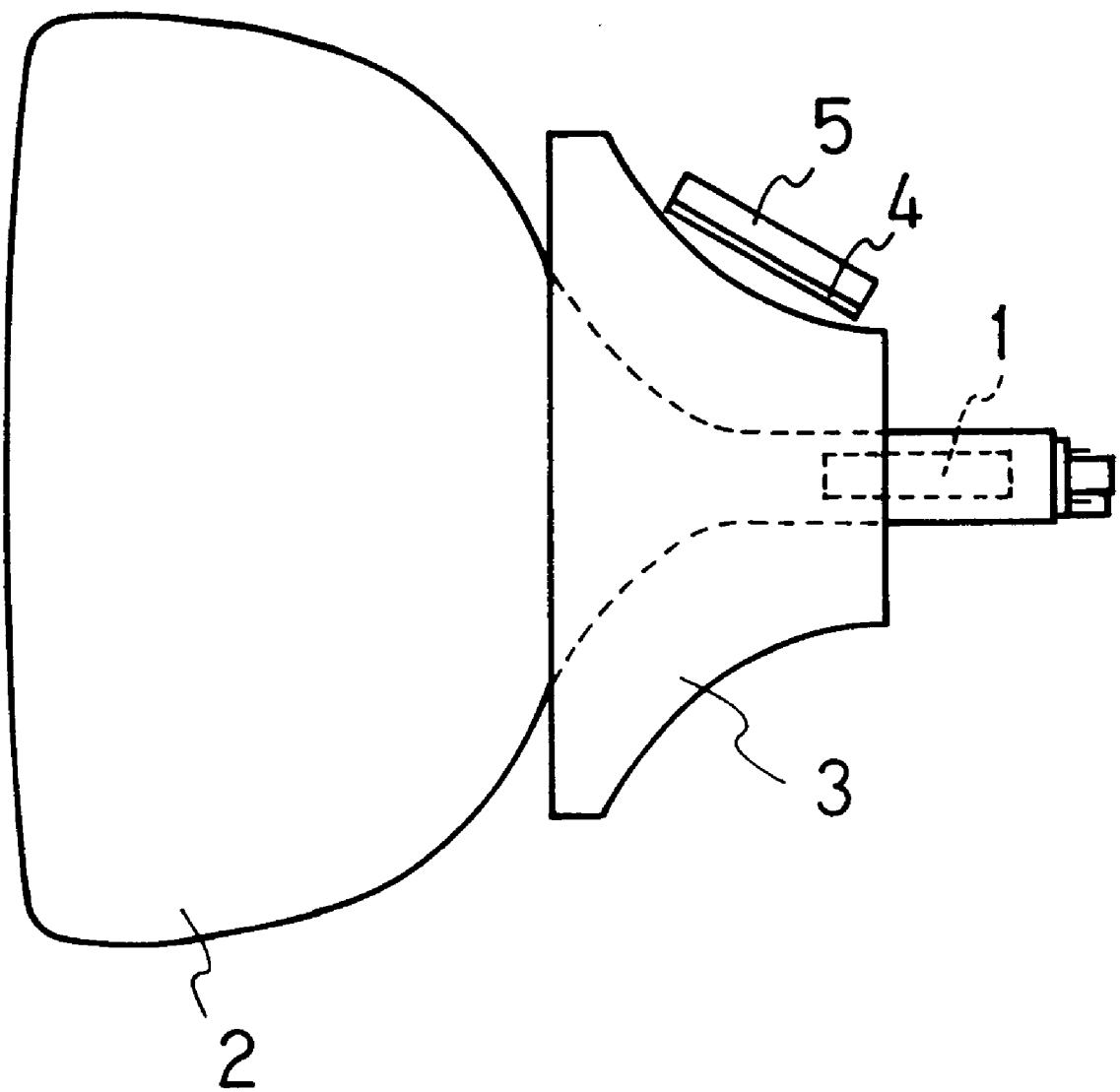
FIG. 16 is a structural drawing of a color picture tube device.

FIG. 16 shows a structural drawing of a color picture tube device according to an example of the present invention. As can be seen in FIG. 16, the color picture tube device comprises a CRT 2 having an inline-type electron gun 1, a self-converging deflection yoke 3, and a printed board 4 for mounting a circuit therefor.

Figure 17:
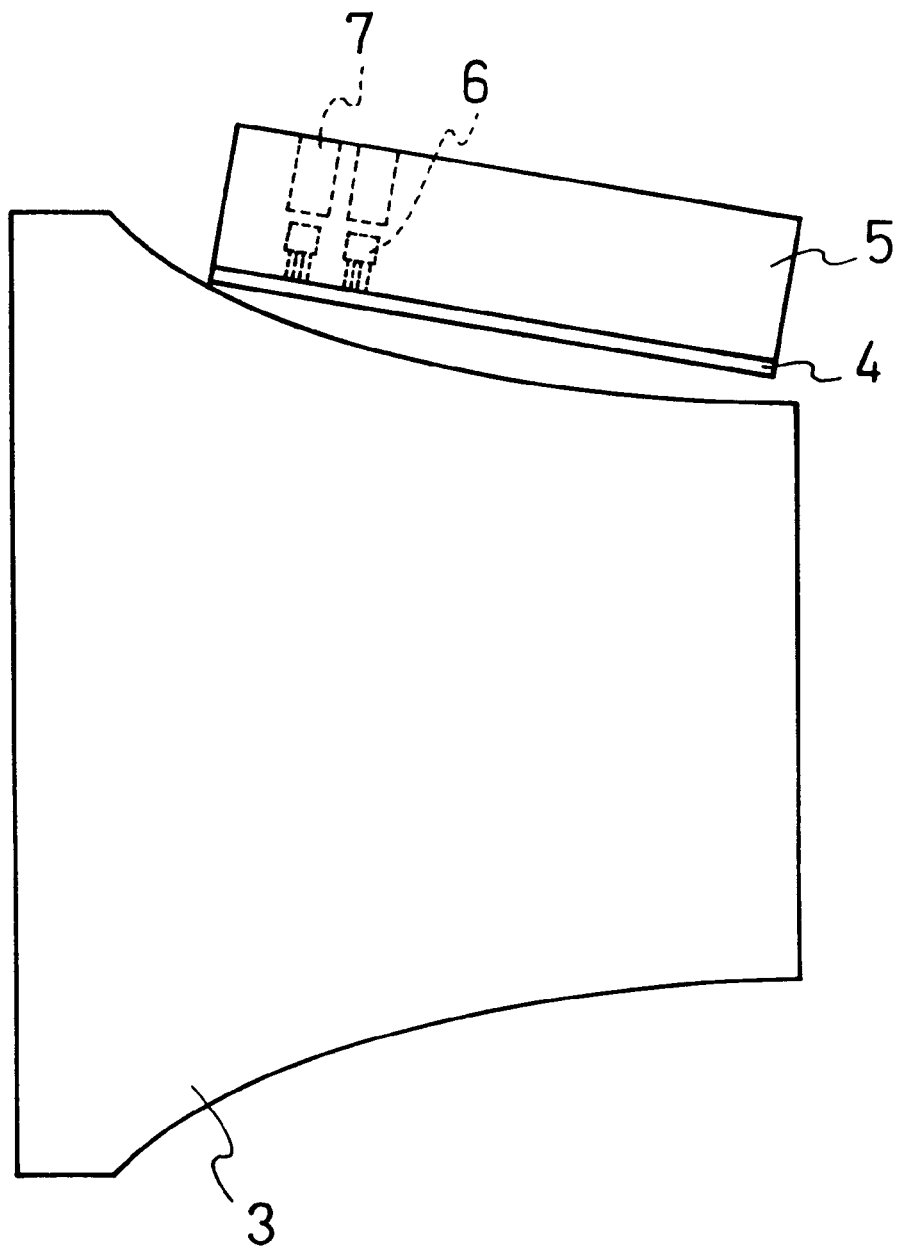
FIG. 17 is a structural drawing of a deflection yoke that is a member of the color picture tube device in FIG. 16 and a printed board installed on the deflection yoke.
Figure 18:
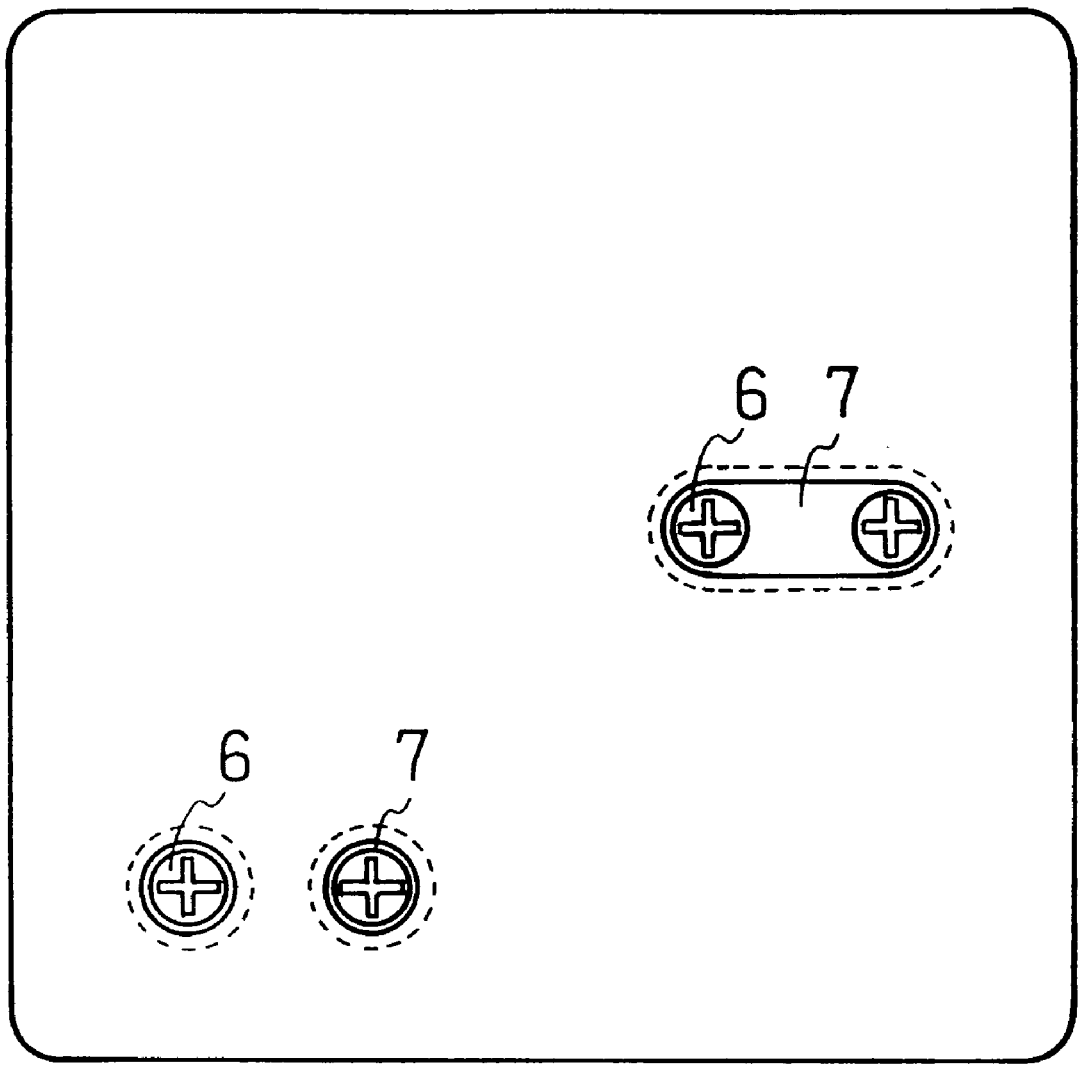
FIG. 18 is a plan view of a terminal board cover according to the prior art.

FIG. 17 shows a structural drawing of the self-converging deflection yoke 3 shown in FIG. 16 and the printed board 4 mounted on the self-converging deflection yoke 3. In order to protect the elements and terminals mounted on the printed board 4, a terminal board cover 5 covering elements and terminals is installed on the printed board 4. This terminal board cover 5 is preferably made of an insulating material such as resin.

The printed board 4 comprises a correction circuit for correcting misconvergence, which comprises adjustable circuit components such as variable resistors. Furthermore, the terminal board cover 5 comprises through holes 7 for passing an adjustment tool when accessing the adjustment areas 6 of the variable resistors in the correction circuit (that is, performing the ITC adjustment). As becomes clear from FIG. 17, these through holes 7 are employed in the terminal board cover 5, directly above the adjustment areas 6 of the variable resistors.

The through holes 7 employed in the terminal board cover 5 are linked to each other by guiding grooves. Therefore, after an adjustment tool has been inserted into one through hole 7, the location of another through hole 7 can be found easily by moving the adjustment tool along the guiding grooves.

Below, specific examples of terminal board covers for color picture tube devices according to the present invention are explained with reference to the drawings.

Figure 1:
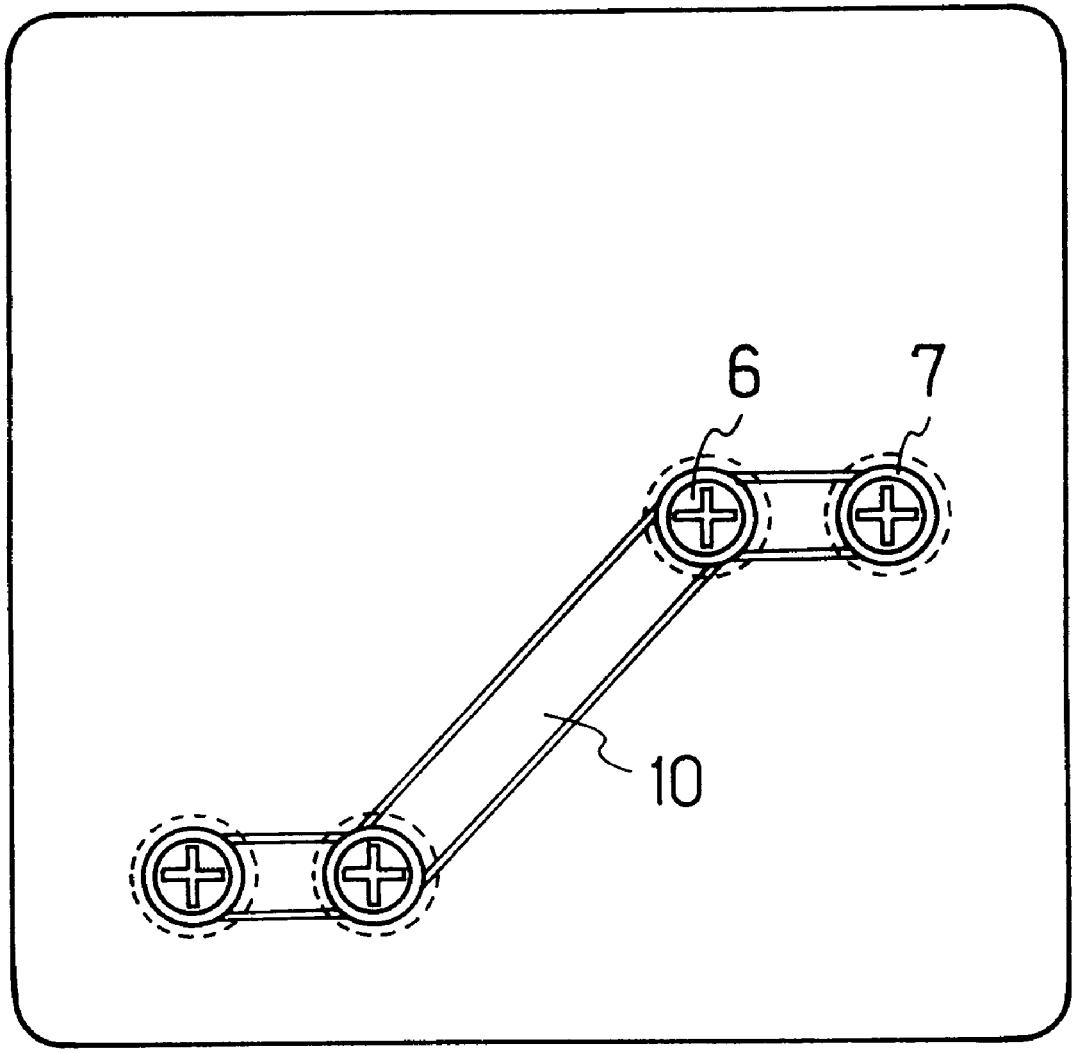
FIG. 1 is a plan view of a terminal board cover according to a first example of the present invention.

FIG. 1 shows a plan view of a terminal board cover according to a first example of the present invention. In the terminal board cover according to this example, through holes 7, which are employed directly above adjustment areas 6 of variable resistors are connected to each other via guiding grooves 10, as has been noted above.

In the ITC adjustment of a deflection yoke comprising such a terminal board cover, after an adjustment tool has been inserted into one through hole 7, the location of another through hole 7 can be found easily by moving the adjustment tool along the guiding grooves 10. This means that operations such as the ITC adjustment easily can be performed, using the tactile sense, without looking at the deflection yoke around the CRT, because it is possible to guess the present position of the adjustment tool by moving the adjustment tool over the guiding grooves 10 and the working positions.

Figure 2:
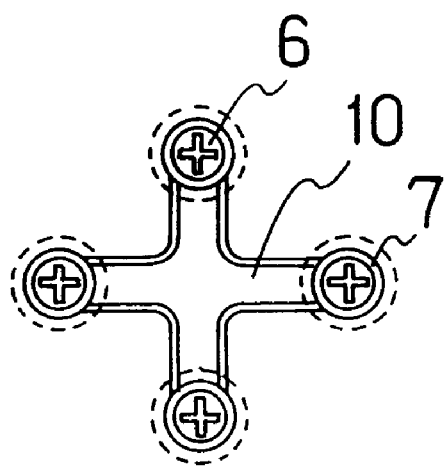
FIG. 2 is a plan view of a terminal board cover according to a second example of the present invention.

FIG. 2 shows a plan view of a terminal board cover according to a second example of the present invention. In the terminal board cover according to this example, four through holes 7 formed in the terminal board cover are connected to each other via a cross-shaped guiding groove 10.

Figure 3:
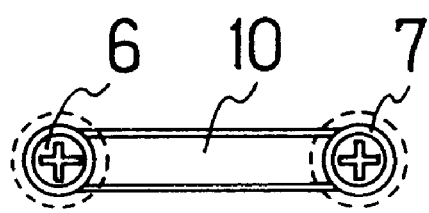
FIG. 3 is a plan view of a terminal board cover according to a third example of the present invention.

FIG. 3 shows a plan view of a terminal board cover according to a third example of the present invention. In the terminal board cover according to this example, two through holes 7 formed in the terminal board cover are connected to each other via a straight guiding groove 10.

Figure 4:
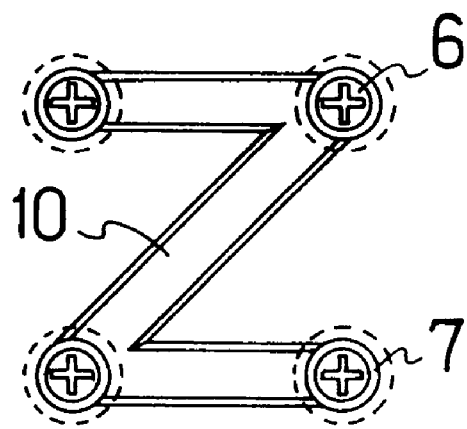
FIG. 4 is a plan view of a terminal board cover according to a fourth example of the present invention.

FIG. 4 shows a plan view of a terminal board cover according to a fourth example of the present invention. In the terminal board cover according to this example, four through holes 7 formed in the terminal board cover are connected to each other via a Z-shaped guiding groove 10.

Figure 5:
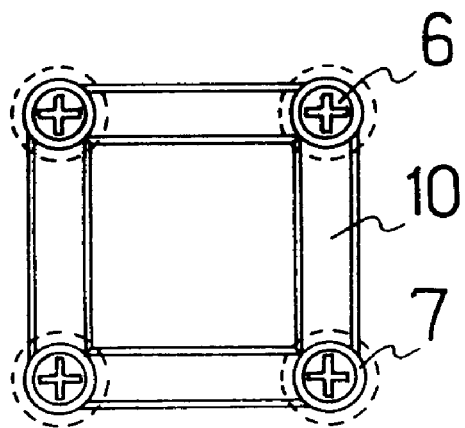
FIG. 5 is a plan view of a terminal board cover according to a fifth example of the present invention.

FIG. 5 shows a plan view of a terminal board cover according to a fifth example of the present invention. In the terminal board cover according to this example, four through holes 7 formed in the terminal board cover are connected to each other via a square-shaped guiding groove 10.

Figure 6:
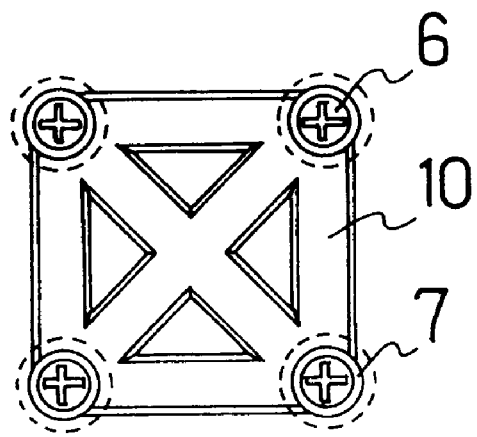
FIG. 6 is a plan view of a terminal board cover according to a sixth example of the present invention.

FIG. 6 shows a plan view of a terminal board cover according to a sixth example of the present invention. In the terminal board cover according to this example, four through holes 7 formed in the terminal board cover are connected to each other via a square shaped guiding groove 10, and straight guiding grooves 10 directly connect the through holes that are diagonally opposite to each other.

When the ITC adjustment is performed in a terminal board cover according to one of the above second to sixth example, it results that, as in the first example, after an adjustment tool has been inserted into one through hole 7, the location of another through hole 7 can be found easily by moving the adjustment tool along the guiding grooves 10. Therefore, it is possible to guess the present position of the adjustment tool by moving the adjustment tool over the guiding grooves 10 and the working positions. Moreover, this guess is easier, when the shape of the guiding groove 10 is a simple shape, such as a cross, a straight line, a "Z"-shape, or a square. Consequently, operations such as the ITC adjustment easily can be performed using the tactile sense only, and without looking at the deflection yoke around the CRT.

Figure 7:
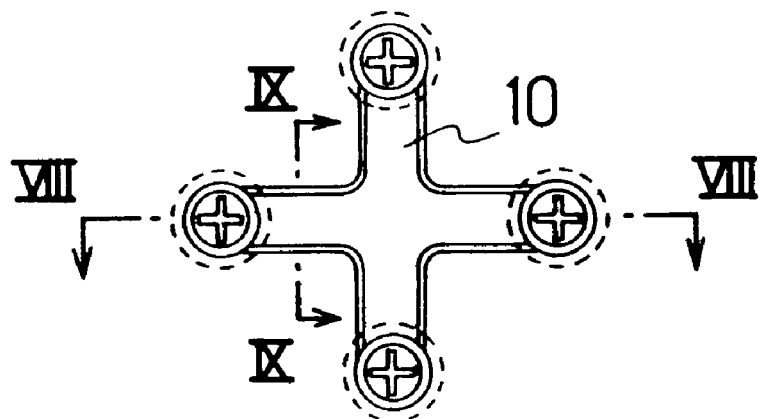
FIG. 7 is a plan view of the terminal board cover according to the second example of the present invention, illustrating the structure of the guiding grooves formed in the terminal board cover.
Figure 8:
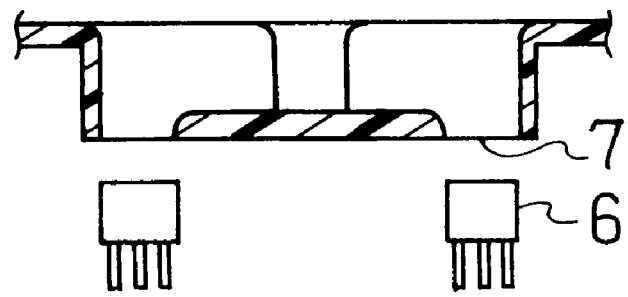
FIG. 8 is a sectional view of the terminal board cover of FIG. 7, taken along line VIII—VIII.
Figure 9:
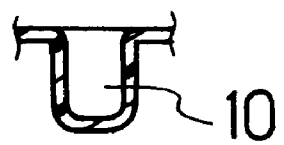
FIG. 9 is a sectional view of the terminal board cover of FIG. 7, taken along line IX—IX.

FIGS. 7–9 show the structure of a guiding groove 10 formed in the terminal board cover, taking the terminal board cover according to the second example of the present invention as an example. FIG. 8 is a sectional view taken along the line VIII—VIII of the terminal board cover shown in FIG. 7, and shows a section taken along a long axis of a guiding groove 10. FIG. 9 is a sectional view, taken along the line IX—IX shown in FIG. 7, and shows a section in a direction perpendicular to a long axis of a guiding groove 10.

As becomes clear from FIG. 9, the cross section of the guiding groove 10 is preferably U-shaped. However, the present invention is not limited to this shape, and other shapes such as V- or W-shapes are also possible.

FIGS. 10–15 show other examples of the terminal board cover according to the present invention, specifically, some examples for other design possibilities of the guiding groove 10.

Figure 10:
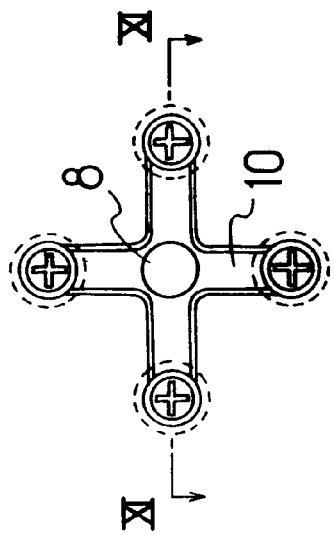
FIG. 10 is a plan view of a terminal board cover according to another example of the present invention.
Figure 11:
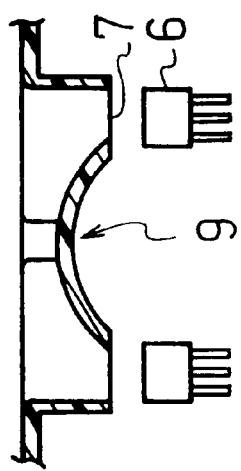
FIG. 11 is a sectional view of the terminal board cover of FIG. 10, taken along line XI—XI.

FIG. 10 is a plan view of a terminal board cover, wherein the terminal board cover comprises a concave reference position area 8, which is lower than the guiding groove 10, in a certain location of the guiding groove 10 connecting the through holes 7 (in the present example, this location is at the intersection of the guiding grooves 10). FIG. 11 is a sectional view taken along the line XI—XI of the terminal board cover shown in FIG. 10, and shows a section, taken along a long axis of the guiding groove 10.

In the present example, when such a reference position area 8 is employed, a visual confirmation to determine a reference position becomes unnecessary. Therefore, the time necessary to perform an ITC adjustment can be shortened, because the confirmation of the position of the adjustment tool during the ITC adjustment becomes easy.

Figure 12:
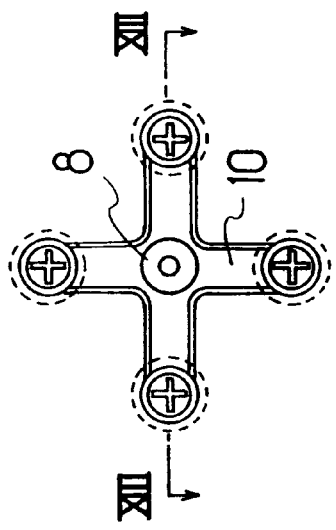
FIG. 12 is a plan view of a terminal board cover according to another example of the present invention.
Figure 13:
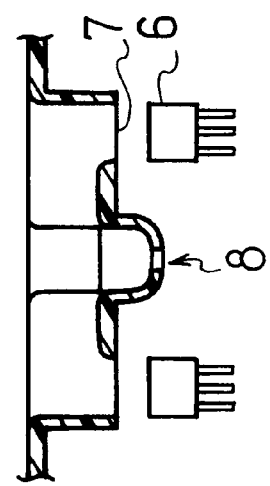
FIG. 13 is a sectional view of the terminal board cover of FIG. 12, taken along line XIII—XIII.

FIG. 12 is a plan view of a terminal board cover, wherein the terminal board cover comprises a concave reference position area 8, which is lower than the guiding groove 10 and has a through hole roughly in the center of the bottom of the concave reference position area 8, located in a certain location of the guiding groove 10 connecting the through holes 7 (in the present example, this location is at the intersection in the guiding grooves 10). FIG. 13 is a sectional view, taken along the line XIII—XIII shown in FIG. 12, and shows a section taken along a long axis of the guiding groove 10.

In the present example, when such a reference position area 8 is employed, a visual confirmation to determine a reference position becomes unnecessary. Therefore, the time necessary to perform an ITC adjustment can be shortened, because the confirmation of the position of the adjustment tool during the ITC adjustment becomes easy. Moreover, by using such a configuration, the adjustment tool can be caused to stand upright, which is extremely useful when after a series of adjustments, another adjustment operation has to be performed.

Figure 14:
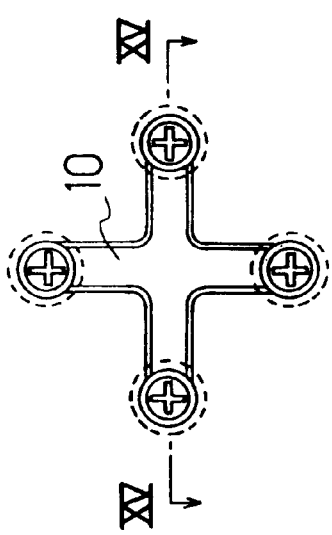
FIG. 14 is a plan view of a terminal board cover according to another example of the present invention.
Figure 15:
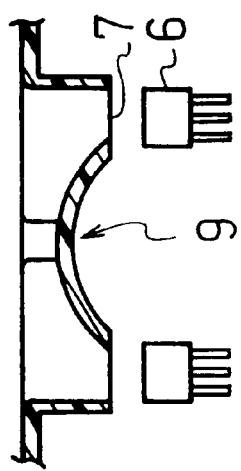
FIG. 15 is a sectional view of the terminal board cover of FIG. 14, taken along line XV—XV.

FIG. 14 is a plan view of a terminal board cover, wherein the guiding groove 10 connecting the through holes 7 has an arch-shaped portion 9. FIG. 15 is a sectional view taken along the line XV - XV shown in FIG. 14, and shows a section, taken along a long axis of the guiding groove 10. In the present example, the shifting of the adjustment tool for ITC adjustment becomes smoother by employing such a structure. Furthermore, by employing such a structure, the guiding of the adjustment tool to the through holes 7 becomes more precise, and the power necessary to insert the adjustment tool can be decreased, so that damage to the variable resistors or the adjustment tool can be prevented.

Moreover, in the present example, a reference position area can be included in a suitable position of the arch-shaped portion 9. By doing so, the time necessary to perform an ITC adjustment can be shortened, because the confirmation of the position of the adjustment tool during the ITC adjustment becomes easy.

Furthermore, examples have been explained, having only one reference position area 8 in the intersection of the guiding groove 10, but the present invention is by no means limited to this configuration, and two or more reference position areas 8 can be included at suitable positions.

Furthermore, only the second example was explained as comprising a reference position area 8 or an arch-shaped portion 9 in the terminal board cover. However, the present invention is by no means limited to these configurations, and a reference position area 8 or an arch-shaped portion 9 may just as well be included in the first or third to sixth example.

Furthermore, in the present examples, the concave reference position area 8 was explained as being lower than the guiding groove 10. However, the present invention is by no means limited to this configuration, and a configuration, wherein, for example, the reference position area 8 is convex and higher than the guiding groove 10, is also possible. There is no restriction concerning the height or the shape of the reference position area, and as long as it can be distinguished from the guiding groove 10 and the through holes 7, any suitable height and shape are possible.

Furthermore, in the present examples, the guiding grooves 10 formed in the terminal board cover were explained as being rectilinear. However, the present invention is by no means limited to this configuration and a configuration, wherein the guiding grooves 10 are e.g. curved, is also possible.

Furthermore, in the present examples, the terminal board cover according to the present invention was explained as being a member of a color picture tube device. However, the present invention is by no means limited to this configuration and a configuration is also possible, wherein the terminal board cover is, for example, a member of a monochrome picture tube, a printer or the like.

According to the present invention, (i) a terminal board cover, wherein the adjustment tool is not completely extracted from the through holes, the adjustment tool can be smoothly shifted between the through holes, and the position of other through holes can be confirmed and determined without visual confirmation, so that the location of the through holes can be easily determined, and (ii) a color picture tube device using the terminal board cover are provided.

To be specific, when adjusting variable resistors using an adjustment tool to perform DY misconvergence adjustment or ITC adjustment, the position of the variable resistors can be confirmed without looking at the terminal board cover, using the tactile sense, only by being guided by the through holes and the guiding grooves. Furthermore, once the adjustment tool is inserted into a through hole, the position of the next variable resistor can be found by sliding the adjustment tool along a guiding groove, without necessitating visual confirmation. Therefore, the operation time for ITC adjustment can be shortened. Compared to the case where the present invention has not been adopted, the ITC adjustment speed can be increased by a factor of more than 1.5, so that the costs for performing an ITC adjustment in a color picture tube device can be reduced by 20%.

Moreover, by employing a reference position area, a reference position can be determined without visual confirmation. Furthermore, by employing an arch-shaped portion, the shifting of the adjustment tool between through hole and through hole, or between through hole and reference position area for ITC adjustment becomes smoother.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. A terminal board cover for covering a printed board comprising adjustable circuit components, wherein through holes for inserting an adjustment tool to adjust the circuit components are formed in the terminal board cover, and the through holes are connected to each other by a guiding groove.

2. The terminal board cover according to claim 1, wherein the terminal board cover is made of an insulating material.

3. The terminal board cover according to claim 1, wherein the guiding groove connecting the through holes has a shape selected from cross-shape, straight shape, Z-shape, square shape, and shapes combining two or more of these shapes.

4. The terminal board cover according to claim 1, wherein the guiding groove connecting the through holes has square shape with straight guiding grooves directly connecting the through holes that are diagonally opposite to each other.

5. The terminal board cover according to claim 1, wherein a reference position area for determining the position of an adjustment tool is formed in the guiding groove.

6. The terminal board cover according to claim 5, wherein the reference position area is concave and lower than the guiding groove.

7. The terminal board cover according to claim 5, wherein the reference position area is convex and higher than the guiding groove.

8. The terminal board cover according to claim 1, wherein the guiding groove comprises an arch-shaped portion.

9. A picture tube device using a terminal board cover according to claim 1.

10. A picture tube device using a terminal board cover according to claim 2.

11. A picture tube device using a terminal board cover according to claim 3.

12. A picture tube device using a terminal board cover according to claim 4.

13. A picture tube device using a terminal board cover according to claim 5.

14. A picture tube device comprising a deflection yoke whereon a printed board comprising the terminal board cover according to claim 1 has been installed.

15. A picture tube device comprising a deflection yoke whereon a printed board comprising the terminal board cover according to claim 2 has been installed.

16. A picture tube device comprising a deflection yoke whereon a printed board comprising the terminal board cover according to claim 3 has been installed.

17. A picture tube device comprising a deflection yoke whereon a printed board comprising the terminal board cover according to claim 4 has been installed.

18. A picture tube device comprising a deflection yoke whereon a printed board comprising the terminal board cover according to claim 5 has been installed.

19. A picture tube device comprising: a cathode ray tube having an electron gun on the inside of a neck portion; and a deflection yoke comprising a horizontal deflection coil for generating a horizontal deflection field and a vertical deflection coil for generating a vertical deflection field; wherein a correction circuit for correcting misconvergence is employed on a printed board installed on the deflection yoke;

the correction circuit includes adjustable circuit components;

the printed board is covered by a terminal board cover;

through holes for inserting an adjustment tool to adjust circuit components of the correction circuit are formed in the terminal board cover; and the through holes are connected to each other with a guiding groove.

* * * * *